United States Patent [19]
Mehta et al.

[11] Patent Number: 5,885,904
[45] Date of Patent: Mar. 23, 1999

[54] METHOD TO INCORPORATE, AND A DEVICE HAVING, OXIDE ENHANCEMENT DOPANTS USING GAS IMMERSION LASER DOPING (GILD) FOR SELECTIVELY GROWING AN OXIDE LAYER

[75] Inventors: Sunil Mehta, San Jose; Emi Ishida, Sunnyvale; Xiao-Yu Li, San Jose, all of Calif.

[73] Assignee: Advanced Micro Devices, Inc., Sunnyvale, Calif.

[21] Appl. No.: 799,235

[22] Filed: Feb. 14, 1997

[51] Int. Cl.$^6$ .......................... H01L 21/461; H01L 21/31
[52] U.S. Cl. .......................... 438/758; 438/770; 438/771; 438/776; 438/787
[58] Field of Search ...................... 438/758, 151, 438/770, 771, 776, 787; 427/457, 496

[56] References Cited

U.S. PATENT DOCUMENTS

| | | | |
|---|---|---|---|
| 4,924,278 | 5/1990 | Logie | 357/23.5 |
| 5,316,969 | 5/1994 | Ishida et al. | 437/168 |
| 5,620,910 | 4/1997 | Teramoto | 438/151 |

Primary Examiner—Charles Bowers
Assistant Examiner—Craig Thompson
Attorney, Agent, or Firm—Fliesler, Dubb, Meyer & Lovejoy

[57] ABSTRACT

A method for forming a uniform and reliable oxide layer on the surface of a semiconductor substrate using projection gas immersion laser doping (P-GILD) is provided. A semiconductor substrate is immersed in an oxide enhancing compound containing atmosphere. The oxide enhancing compound containing atmosphere may include phosphorus, arsenic, boron or an equivalent. A 308 nm excimer laser is then applied to a portion of the substrate to induce incorporation of the oxide enhancing compound into a portion of the substrate. The deposition depth is dependent upon the strength of the laser energy directed at the surface of the substrate. A uniform and reliable oxide layer is then formed on the surface of the substrate by heating the substrate. The laser may be applied with a reflective reticle or mask formed on the substrate. An E$^2$PROM memory cell having a program junction region in a silicon substrate is also provided. An oxide layer is positioned between a program junction and a floating gate. The oxide layer is formed by a single or multiple thermal oxidation step(s) to have at least a first oxide thickness due to a GILD oxide enhancing compound underlying a region of the oxide having at least the first oxide thickness.

25 Claims, 5 Drawing Sheets

METHOD TO INCORPORATE, AND A DEVICE HAVING, OXIDE ENHANCEMENT DOPANTS USING GAS IMMERSION LASER DOPING (GILD) FOR SELECTIVELY GROWING AN OXIDE LAYER

CROSS REFERENCE TO RELATED APPLICATIONS

The following co-pending U.S. patent applications are assigned to the assignee of the present application, are related to the present application and its disclosure is incorporated herein by reference:

(A) Ser. No. 08/799,230 by E. Ishida, et al. and entitled METHOD OF SELECTIVELY ANNEALING DAMAGED DOPED REGIONS.

(B) Ser. No. 08/799,153 by E. Ishida, et al. and entitled METHOD TO INCORPORATE NITROGEN SELECTIVELY FOR DIFFERENTIAL OXIDE GROWTH.

(C) Ser. No. 08/799,236 by Mehta, et al. and entitled A METHOD FOR ANNEALING DAMAGED SEMICONDUCTOR REGIONS ALLOWING FOR ENHANCED OXIDE GROWTH.

(D) Ser. No. 08/689,523 by Barsan, et al. and entitled AN INTEGRATED CIRCUIT HAVING, AND PROCESS PROVIDING, DIFFERENT OXIDE LAYER THICKNESSES ON A SUBSTRATE.

(E) Ser. No. 08/561,306 by Barsan, et al. and entitled MULTIPLE GATE OXIDE THICKNESSES ON A WAFER SUBSTRATE.

(F) Ser. No. 08/699,401 by Mehta, entitled OXIDE FORMATION PROCESS FOR MANUFACTURING PROGRAMMABLE LOGIC DEVICE.

CROSS REFERENCE TO RELATED PATENTS

The following U.S. Patent is assigned to the assignee of the present application, is related to the present application and its disclosure is incorporated herein by reference:

(A) U.S. Pat. No. 4,924,278 issued May 8, 1990, to Logie and entitled EEPROM USING A MERGE SOURCE AND CONTROL GATE.

BACKGROUND OF THE INVENTION

1. Field of the Invention

The invention relates to the process for providing oxidation enhancement dopants into a semiconductor substrate using Gas Immersion Laser Doping ("GILD"), particularly for forming an oxide layer.

2. Description of the Related Art

A prevalent trend in the semiconductor industry is to increase the density of semiconductor devices formed on silicon substrates.

Programmable logic devices (PLD) are circuits which can be configured by a user to perform logic functions or serve as memory arrays. Generally, PLDs include a programmable array of cells and array control circuitry which is utilized to program the array with the desired implementation. The programmable array comprises a series of low-voltage, short channel floating gate transistors which store charge to reflect whether a particular cell is programmed with a bit of data. The programmed array reflects a particular user's individual configuration for the programmable device, allowing users to customize the programmable logic device for a number of different applications.

One type of programmable logic device which has become popular due to its performance and cost characteristics are electrically erasable complementary metal oxide semiconductor ($E^2CMOS$) PLDs.

$E^2CMOS$ technology is based on the concept of a stored charge on a floating gate. Electrons are transferred to the gate through a physical mechanism known as Fowler-Nordheim tunneling. For an electrically erasable cell, a tunnel oxide is present between the source and drain regions and the floating gate that is about one-third of the thickness of a traditional transistor gate oxide. Fowler-Nordheim tunneling involves placing a potential across the tunnel oxide which distorts the electric field and allows electrons to traverse the tunnel oxide upon which they become trapped on a floating gate.

The control circuitry of the cell—the program transistors or so-called write transistors—essentially comprise high voltage transistors capable of sustaining high electric fields. So called read transistors, which operate at low voltage, include a first junction, second junction and gate (defined by the word line of the device). The control gate includes the program junction which is separated from the floating gate by an oxide layer having a thickness of approximately 180 Å. The program transistor includes a first junction, second junction and a gate which also rests on the oxide layer. The memory cell will also include a floating gate, separated from the program junction by a tunnel oxide which may be activated by the control gate. The thickness of tunnel oxide is in a range of approximately 80–100 Å.

When programming or erasing the device, a voltage is applied between the program and control gate nodes. The direction of the voltage determines whether the cell is erased or programmed. When erasing, the control gate is given a positive voltage and the program node is grounded. When programming, the program node voltage is elevated and the control gate is grounded.

Several alternative designs of memory cells are utilized. Characteristically, in an $E^2CMOS$ PLD, four types of transistors are required: high voltage P channel, high voltage N channel, low voltage P channel, and low voltage N channel.

The trend of $E^2CMOS$ PLD devices has been toward lower and lower supply voltages. Consequently, this has required a corresponding scaling down of the oxide layers in the various transistors and at the program junctions. As the oxide thicknesses have been reduced, it is particularly important that the program junction oxide is uniform and of high quality in order to ensure reliable electrical characteristics.

U.S. Patent Applications entitled AN INTEGRATED CIRCUIT HAVING, AND PROCESS PROVIDING, DIFFERENT OXIDE LAYER THICKNESSES ON A SUBSTRATE and MULTIPLE GATE OXIDE THICKNESSES ON A WAFER SUBSTRATE referenced above discloses methods for forming different oxide thicknesses on a semiconductor substrate. In particular, these applications disclose a method for forming a write transistor with a first oxide thickness, a read transistor with a second oxide thickness and a tunnel oxide with a third oxide thickness.

In formation of oxides in general, it is generally known that the provision of phosphorus or arsenic into the silicon substrate prior to forming the oxide by thermal formation in an oxygen atmosphere results in a different growth of oxide between the region overlying the phosphorus or arsenic deposited region and the region of the substrate where no phosphorus or arsenic has been deposited. However, where the oxide thicknesses are relatively small, care must be taken not to damage the surface of the silicon substrate, as growth of the oxide will be impaired.

Conventionally, phosphorus or arsenic may be beam-line ion implanted at a relatively low energy into the substrate. However, ion implantation can cause substrate damage which is difficult to anneal out using conventional methods, and compromise the quality or uniformity of the oxide grown for small thicknesses. Thus, semiconductor device yield and reliability is reduced leading to higher manufacturing costs.

Therefore, it is desirable to have a method for forming reliable high quality and uniform oxide at reduced manufacturing costs. In particular, it is desirable to have a method to form a uniform relatively small thickness oxide layer over a program junction. Further, it is desirable to provide an E$^2$PROM memory cell having a uniform relatively small thickness oxide layer over a program junction in order to ensure reliable memory cell operation.

SUMMARY OF THE INVENTION

According to one aspect of the present invention, a method for forming an oxide on the surface of a semiconductor substrate is provided. The method includes placing the semiconductor substrate in an oxidation enhancing atmosphere. Laser energy is then applied to at least the first portion of the substrate and an oxide is formed on the surface of the substrate by heating the substrate.

According to another aspect of the present invention, the method further comprises the step of positioning a reflective reticle to the semiconductor substrate.

According to another aspect of the present invention, the method further comprises forming a mask on the semiconductor substrate.

According to another aspect of the present invention the oxide enhancement atmosphere includes phosphorus, arsenic or boron.

According to another aspect of the present invention, a method for forming an oxide on the surface of a semiconductor substrate comprises first immersing the semiconductor substrate in a phosphorus containing atmosphere. A laser is then applied to a portion of the substrate to induce incorporation of the phosphorus into the portion of the substrate to a depth dependent upon the strength of the laser energy directed at the surface of the substrate. An oxide is then formed on the surface of the substrate by heating the substrate in an oxidizing ambient such that the portion of the oxide formed over the selected portion is formed at a different rate than a portion of the oxide formed over the region of the substrate not including the selected portion.

According to another aspect of the present invention, the incorporation is through liquid phase diffusion.

According to another aspect of the present invention, the incorporation is through solid phase diffusion.

According to another aspect of the present invention, the energy of the laser is between approximately 750 mJ/cm$^2$ and approximately 1.3 J/cm$^2$.

According to another aspect of the present invention, a method for forming an oxide on the surface of the semiconductor substrate wherein the oxide has at least a first thickness and a second thickness is provided. The method includes a gas-induced laser doping of a region of the substrate with oxide enhancement material and heating the substrate in an oxygen atmosphere.

According to another aspect of the present invention, an E$^2$PROM memory cell having a program junction region in a semiconductor substrate is provided. The E$^2$PROM memory cell includes at least a first program junction provided in the silicon substrate. A floating gate having a portion positioned over the program junction is also included in the E$^2$PROM memory cell. An oxide layer is positioned between the program junction and the floating gate. The oxide layer is formed by a single thermal oxidation step to have at least a first oxide thickness due to gas immersion laser doped oxide enhancing compound underlying a region of the oxide having at least the first oxide thickness.

BRIEF DESCRIPTION OF THE DRAWINGS

The invention will be described with respect to the particular embodiments thereof. Features and advantages of the invention will become apparent with reference to the specification and drawings in which.

DETAILED DESCRIPTION OF THE PREFERRED EMBODIMENTS

In the following description, numerous details, for example, specific materials, process steps, etc., are set forth in order to provide a thorough understanding of the present invention. It will be obvious, however, to one skilled in the art that the specific details need not be employed to practice the present invention. Moreover, specific details of particular processes or structures may not be specifically presented in order not to unduly obscure the invention where such details would be readily apparent to one of average skill in the art.

Figure 1:
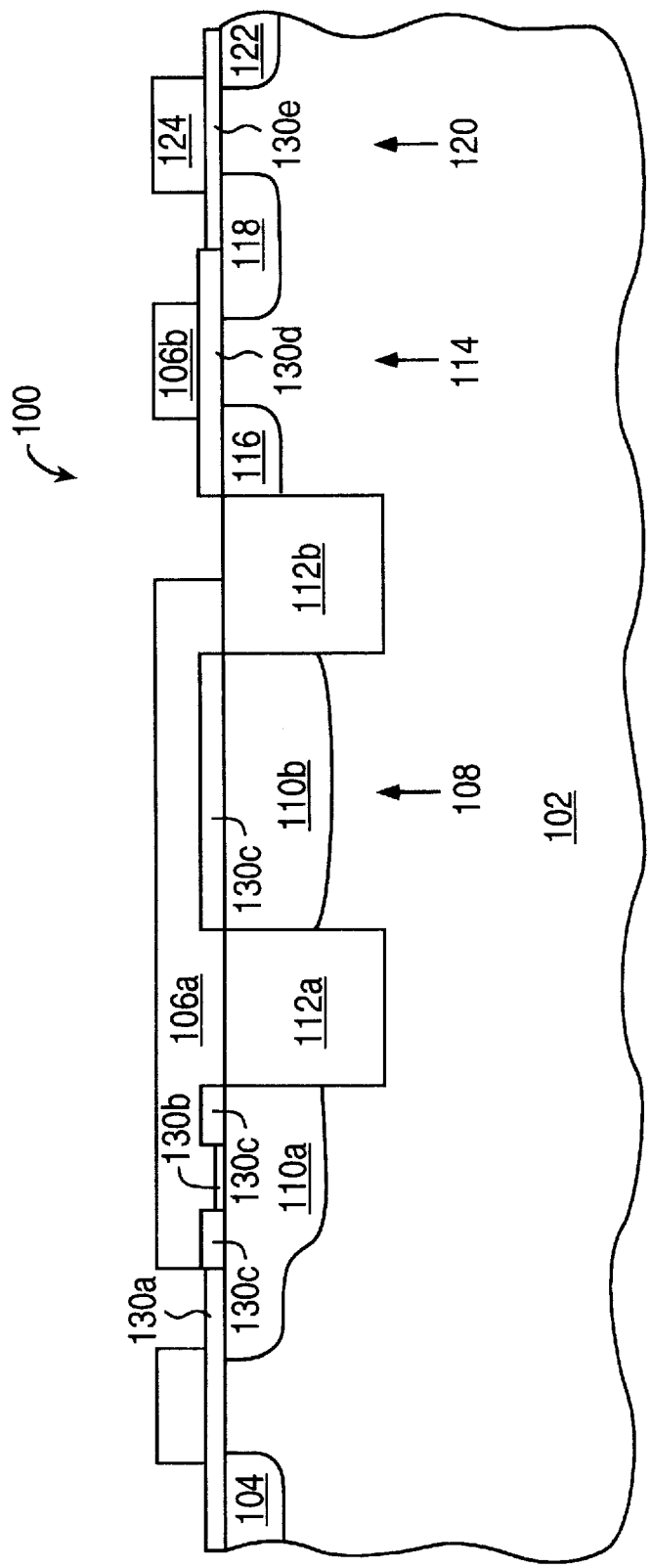
FIG. 1 is an illustrative cross-section of a conventional E$^2$PROM memory cell which may be formed in accordance with the present invention.

FIG. 1 is an illustrative cross-section of an exemplary E$^2$PROM memory cell. FIG. 1 does not show an actual cross section of a manufactured E$^2$PROM cell, but rather an illustrative cross-section of the various transistors and their internal connections. The process of the present invention is useful in forming an E$^2$PROM memory cell. However, the method of the present invention is not limited to uses with E$^2$PROM memory technology and one of average skill in the art will readily recognize the myriad uses of the method in any application requiring a uniform oxide layer at a relatively small thickness.

As shown in FIG. 1, the E$^2$PROM memory cell 100 is formed on a semiconductor substrate 102 having a surface 104. The cell comprises floating gates 106a–b, control gate 108 and program junctions 110a–b. Field oxide regions 112a–b separate active regions of the semiconductor devices. A sense transistor 114 is formed by junction regions 116 and 118 and floating gate 106b, while the read transistor 120 is formed by junction region 118, junction region 122 and gate 124. Various thicknesses of an oxide layer 130 cover the surface 104 of semiconductor 102. The oxide 130 has a thickness of, for example, 150 Å at region 130a, a thickness of 88 Å at region 130b, the tunnel oxide region, a thickness of 180 Å at region 130c overlying the control gate and a portion of program junction 110a, a thickness of 150 Å over the channel of sense transistor 114 at region 130d, and a thickness of 80 Å over the channel of read transistor 120 at region 130e.

These oxide thicknesses have been provided for illustrating this particular embodiment. In other embodiments, other oxide thicknesses may be used. For example, other oxide thicknesses are described in the above-referenced patent applications entitled AN INTEGRATED CIRCUIT HAVING, AND PROCESS PROVIDING, DIFFERENT OXIDE LAYER THICKNESSES ON A SUBSTRATE. It should also be understood that for convenience, the oxide layers shown in the following figures is depicted growing only upwards from the oxidated surface. In actuality, the oxide layer grows bidirectionally above and below the initial surface.

Operation of memory cell 100 is also described in detail in the above-referenced patent application entitled AN INTEGRATED CIRCUIT HAVING, AND PROCESS PROVIDING, DIFFERENT OXIDE LAYER THICKNESSES ON A SUBSTRATE.

Figure 2:
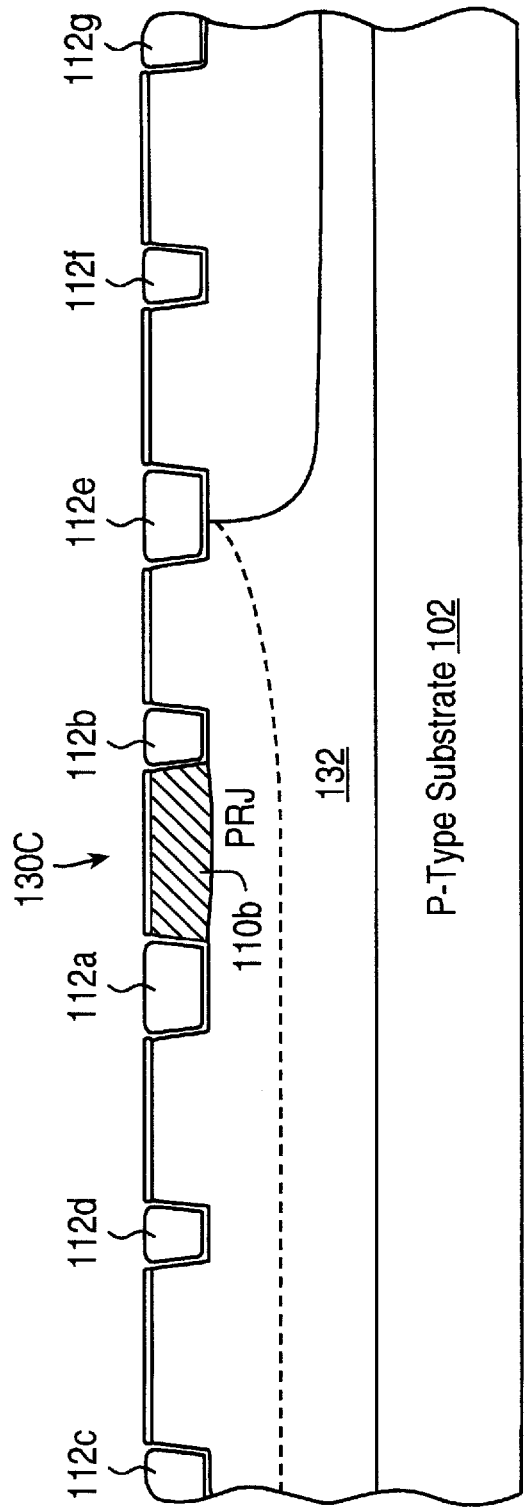
FIG. 2 is a cross-section of a semiconductor substrate during the formation of an E$^2$PROM memory cell showing portions of the cell being formed.

FIG. 2 illustrates a procedure for forming oxides of varying thickness on a semiconductor substrate, and particularly for forming the gate oxide layer 130 of E²PROM cell 100 shown in FIG. 1. FIG. 2 shows substrate 102 upon which has been formed a well region 132, field oxide regions 112a–112g, an oxide layer 130c, and the program junction region 110b. It should be readily understood that numerous process steps are required to reach the cross-section representation of the substrate shown in FIG. 2.

By way of example, the wafer undergoes a number of pre-growth etching, cleaning and implant steps. More specifically, cleaning steps, barrier oxidation steps, and zero level etching steps will have been performed on the substrate 102. In addition, well implant regions may be provided in substrate 102 in accordance with known techniques. (For example, an implant of boron at $5.6 \times 10^{12}$ atom/cm.² at 60 KeV.) Subsequently, source/drain regions, isolated from each other by field oxide regions, will be formed by depositing, for example, a nitride layer of between 1,500 and 1,800 Å on the substrate, forming a source/drain mask over the nitride layer, and etching the nitride layer leaving portions of the layer covering the source/drain regions. It should be recognized that the wells may be formed subsequent to the source/drain pattern etch.

Subsequently, device isolation regions may be formed in the substrate. Such regions are typically formed by so-called shallow trench oxidation or local oxidation of silicon (LOCOS) processes. In a LOCOS process, for example, field oxide regions 112a–112g are formed in substrate 102 by placing the substrate in an atmosphere of oxygen with 0.5% HCl at a temperature of about 1,100° to 1,150° C. to form oxide regions 112a–112g having a thickness of between 3,700 and 4,300 Å. As is well known, the nitride portions remaining on the substrate cover the source/drain regions and prevent field oxidation in these regions. An etch back is subsequently performed on the field oxide layer and the nitride layer removed leaving source/drain substrate regions remaining between field oxide regions 112a–112g.

Additional conventional processing steps include: forming the program junction 110b through the use of a program junction mask layer, implant and anneal; an n-channel field mask and implant; a cell mask and implant; high-voltage n-type implant; high-voltage p-type implants; punch-through masking and implants; and a high-voltage gate oxide cleaning step.

Gate oxidation layer 130C is also conventionally formed by placing the structure shown in FIG. 2 without the associated gate oxide layer in an oxygen-containing atmosphere 900° C. for approximately thirty minutes to create a gate oxide layer having an initial thickness of approximately 125 Å on a substrate and 150 Å on a program junction. After a second oxidation which simultaneously forms the tunnel oxide 130b, oxide layers 130a and 130d have a thickness of approximately 150 Å and oxide layer 130c has a thickness of approximately 180 Å.

It is generally known that the provision of oxidation enhancing compound underlying the surface of a semiconductor substrate will enhance the oxidation of thermal oxide formed on the substrate. This phenomenon, generally referred to as differential oxide growth, takes advantage of the differential rate of oxidation of pure silicon versus the enhanced rate of oxidation of silicon doped with an oxidation enhancing compound. Conventionally, phosphorus ($P^+$), or arsenic ($As^+$) is implanted into the surface of the semiconductor substrate in order to achieve this effect. Beam-line ion implantation is a useful process for providing the oxidation enhancing compound in the semiconductor substrate, but does have certain drawbacks. With respect to providing small transistor geometries, one critical limitation is that the silicon substrate can be damaged by the implant process. Damage caused by the implant process necessitates a subsequent annealing at high temperature to cure the damage in small geometry applications. This annealing step can itself lead to unpredictability in the migration of other dopants in the structure being processed. Often, the damage caused by the implant process can't be annealed out within practical thermal budgets. In addition, the implant will cause a region of damage adjacent to the substrate surface which will prohibit the uniform growth of relatively thin oxide layers.

An alternative form of doping which has heretofore not been widely used in processing semiconductor devices is gas immersion laser doping (GILD). Generally, with laser doping, the silicon surface is exposed to intense irradiation by an excimer laser for a period lasting only several nanoseconds (approximately 50 ns or less). During this period, the silicon surface transitions from solid to liquid, at which time dopants diffuse into the liquid silicon.

Specifically, laser doping uses an excimer laser, often as XeCl laser, as an energy source. In projection gas immersion doping (P-GILD) a reflective reticle is used. The output of the laser is directed through optics to homogenize the beam and then passed through an illuminator to scan the beam over a dielectric reticle. The reticle is then imaged, via projection optics, onto the wafer. In the illuminated areas, the incident photon energy is absorbed in approximately the top 7 nm of the silicon and converted to thermal energy, heating the surface and activating the diffusion of the impurities into the substrate. More information with respect to laser doping is contained in Weiner & McCarthy, "Fabrication of sub-40-nm p-n junctions for 0.18 μm MOS device applications using a cluster-tool-compatible, nanosecond thermal doping technique," Microelectronic Processes, Sensors, & Controls, Vol. 2091 (Int'l Soc. for Optical Eng., September 1993).

Laser doping is advantageous for several reasons. First, dopants generally will penetrate throughout the liquid silicon, but will only minimally diffuse into the solid regions. Thus, junction depth is controlled by the melt depth of the silicon. Second, high-temperature anneal steps are not required because impurities are incorporated into electrically active sites and no damage is imparted to the substrate due to epitaxial regrowth of the silicon. Third, control of the process is generally simple. Fourth, the process results in low sheet and contact resistances. And finally, the process eliminates considerable photoresist processing.

For a detailed analysis of laser doping techniques, see Stanford University Ph.D. Thesis by Emi Ishida entitled "New Methods of Shallow Junction Formation in Silicon Using Gas Immersion Laser Doping" (November 1994), hereby specifically incorporated by reference.

FIGS. 3–8 show a first embodiment of the present invention wherein the P-GILD process is used to provide an oxidation enhanced dopant or compound in a semiconductor substrate and form an oxide layer having first and second thicknesses in a single oxide growth step. In an embodiment, the oxide enhanced dopant is phosphorus in the form of $PH_3$ or $PF_5$. In an alternate embodiment, the oxidation enhanced dopant may be arsenic in the form of $AsH_3$ or $AsF_5$.

Figure 3:
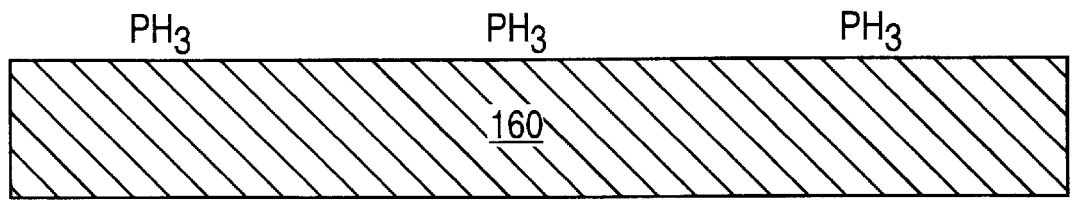
FIGS. 3–8 are cross-sections of a semiconductor substrate showing a first embodiment for forming an oxide enhancing region employing an oxide on the surface of the substrate.
Figure 4:
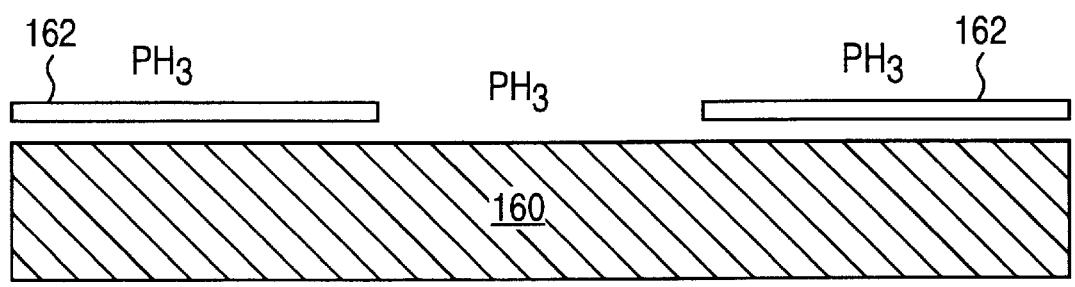
Figure 5:
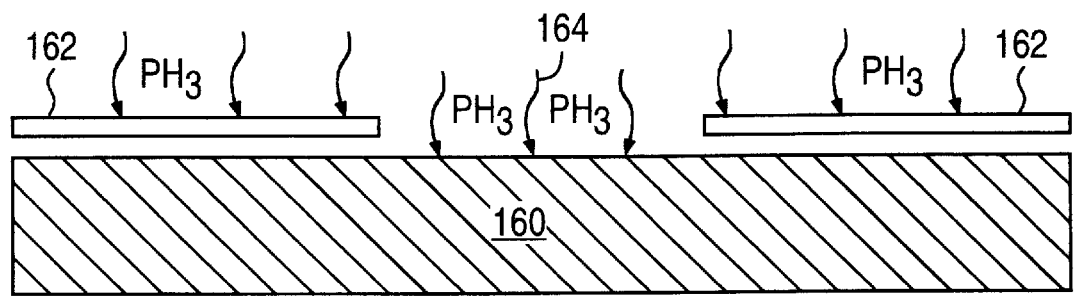
Figure 6:
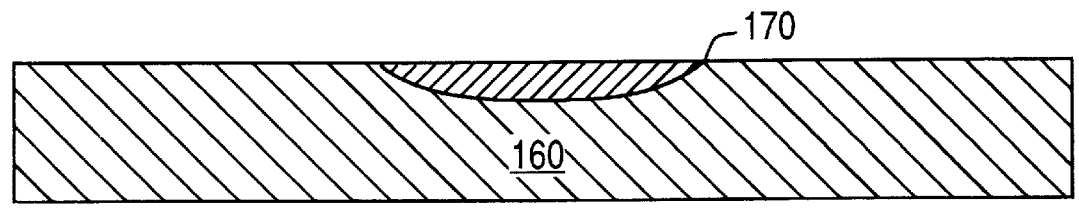

FIG. 3 shows a semiconductor substrate 160 upon which an oxide is to be formed immersed in an oxidation enhanced dopant containing atmosphere such as phosphorus. Substrate 160 may represent a semiconductor substrate at any of a number of various locations in a larger semiconductor manufacturing process wherein an oxide layer needs to be formed having different thicknesses. It should be recognized that the invention is not limited to a particular process or technology. However, in an embodiment the subsequently grown oxide layer 174 shown in FIG. 8 corresponds to oxide layer 130c shown in FIGS. 1 and 2. FIG. 5 shows a reflective reticle 162 comprised of, for example, a dielectric stack or diffractive mask positioned above substrate 160 in an oxidation enhancing compound containing atmosphere. The oxidation enhancing compound containing atmosphere may be comprised of phosphorus, arsenic, boron or antimony in the forms of $AsH_3$, $PH_3$, $AsF_5$, $PF_5$, $BF_3$, or $B_2H_6$ or an equivalent. A reflective reticle and laser is used in incorporating phosphorus, arsenic, boron or an equivalent using the GILD process; the process does not require a separate masking layer, although in an alternative embodiment of the present invention, a reflective masking layer may be utilized. As shown in FIG. 5, laser energy represented by arrows 164 is applied through the phosphorus containing atmosphere to form a phosphorus region 170 in substrate 160 as shown in FIG. 6. In an embodiment, phosphorus region 170 corresponds to program junction 110a and 110b.

In general, there are two types of gas immersion laser doping which can be utilized to provide the phosphorus in region 170. In conventional GILD processing, doping occurs when the laser energy incident on the surface of substrate 160 is sufficient to melt the silicon surface. Absorbed dopant gas species diffuse into the molten silicon layer, and dopants are incorporated upon epitaxial regrowth.

The energy fluence of the laser at the surface of the sample determines the duration of the melt which occurs at the surface. The melt duration is related to the maximum melt depth, which will result in the junction depth of the phosphorus incorporation since solid phase diffusion beyond the melt can be avoided for the less than one microsecond thermal cycle of the process. The relationship between melt time and maximum melt depth depends on the temporal profile of the laser beam. Precise control of junction depth is possible due to the capability of measuring the full width half maximum (FWHM) of the laser and the surface melt duration during the laser doping process. Relatively large changes in the energy fluence are required to create small changes in the maximum melt depth. The dosage is controlled by the total melt time. The total melt time can be varied by varying the number and/or energy of the laser pulses.

In a melt process, the silicon is molten for approximately 30–100 nanoseconds. It will cool in approximately 1 microsecond. It should be recognized that the power of the laser is relative to the junction depth of the implant. A laser having energy of approximately 750 $mJ/cm^2$ to approximately 1.3 $J/cm^2$ results in junction depths ranging from 20 nanometers to approximately 150 nanometers.

The ambient in the deposition chamber is about a 50 torr dopant ambient, in which the substrate is irradiated with pulses from a 308 nm excimer laser at a 9 Hz repetition rate.

A second form of the GILD process can be utilized under "non-melt" conditions. Non-melt GILD allows greater control of the dose and incorporates dopants into the silicon substrate by solid-phase diffusion. Conditions for "non-melt" are determined using in-situ a separate HE-NE laser to perform reflectivity measurements to monitor the melt to non-melt transition. The exact principles of this process are described in the aforementioned Ishida reference.

Non-melt doping is achieved by using sub-melt laser energy fluences, higher pulse repetition rates, and 100-fold greater number of pulses than that compared with conventional GILD. The solid region occurs in a range of fluences less than 650 $MJ/cm^2$. Although fully melted layers are completely activated, non-melt dope layers are not and generally require an annealing step to complete activation. In addition, there is a chance that some damage to the underlying silicon substrate which would affect the growth of oxide layers may result from solid phase diffusion of dopants under non-melt GILD.

Figure 7:
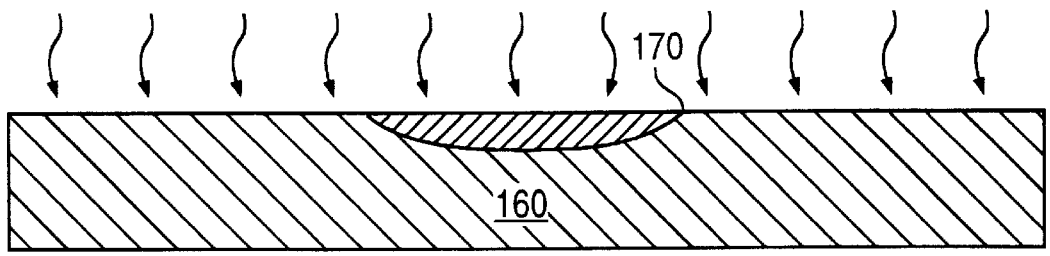

If solid phase diffusion is used, a subsequent application of laser energy, shown in FIG. 7, of a sufficient strength to melt the region to the full depth, may be required to cure the damage caused by the solid phase deposition. The energy of the laser applied in this step can be controlled to an accuracy necessary to melt only the surface of the substrate to a depth (typically 7–150 nm) that the dopant has diffused into the substrate. Once melted, the silicon will reform as epitaxial silicon and any damage which is imparted to the surface of the substrate 160 during the dopant process will be removed. This allows re-crystallization of the silicon. Alternative forms of curing the damage to the substrate may be utilized, such as, for example, annealing the region 170 utilizing a rapid thermal anneal.

If a melt GILD process is utilized, the reapplication of laser energy as illustrated in FIG. 7 is not necessary, as the surface of the silicon substrate will recrystallize upon cooling. However, the reapplication of laser energy may be utilized if desired.

Figure 8:
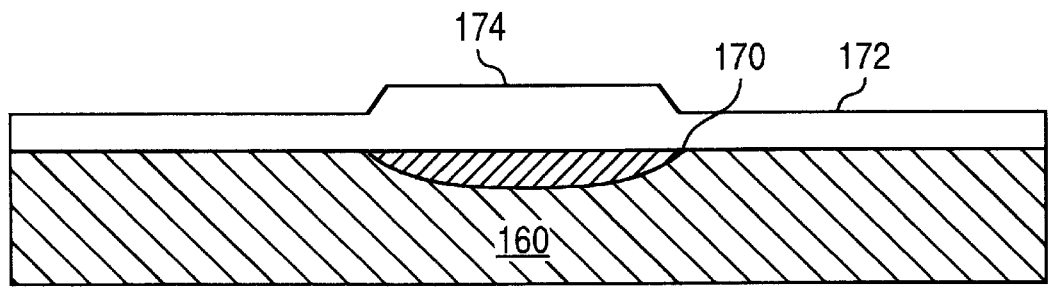
Figure 9:
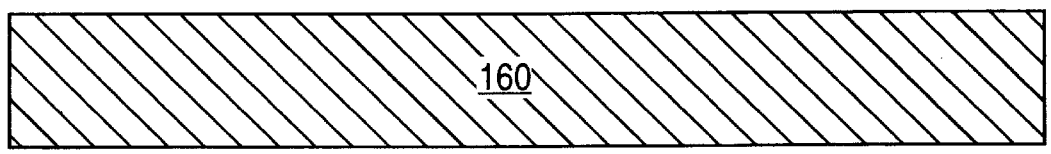
FIGS. 9–14 demonstrate a second embodiment for forming an oxide enhancing region below the surface of a semiconductor substrate and forming an oxide through differential oxide growth.

Subsequently, as shown in FIG. 8, substrate 160 can be placed in an oxygen containing atmosphere at a temperature of approximately 900° C. sufficient to thermally oxidize the surface of the substrate to grow an oxide layer 172 having a sufficient thickness on undoped regions of substrate 160, while growth in region 174 is enhanced by the phosphorus implant region 170. In an embodiment, the resulting oxide region will have a first thickness of approximately 180 Å in region 174, and a second thickness of approximately 150 Å in the undoped regions of the substrate. In another embodiment, the oxide regions will have a first thickness of approximately 88 Å in region 174 and a second thickness of approximately 80 Å on undoped substrate.

In the aforementioned P-GILD method of the present invention, the lithography stepper is combined with the GILD doping tool. The laser is patterned by projecting the beam through a reticle, eliminating the need for an aluminum reflectivity mask. This, in turn, eliminates the need for a photoresist and solvents associated with each masking step. However, in an alternate embodiment the GILD process may be utilized with a reflective mask on the surface of the substrate to incorporate oxide enhanced dopants in a silicon substrate.

Figure 10:
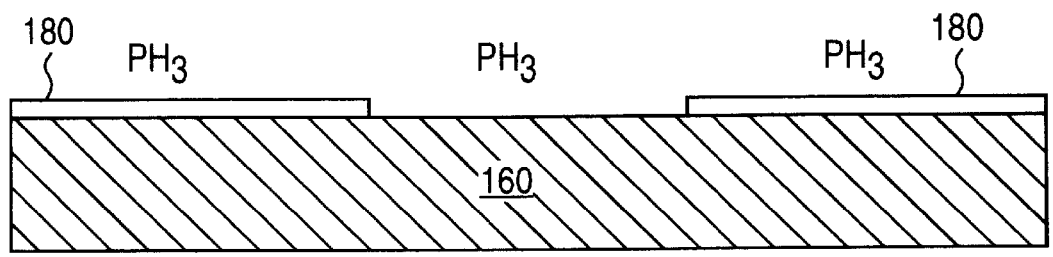
Figure 11:
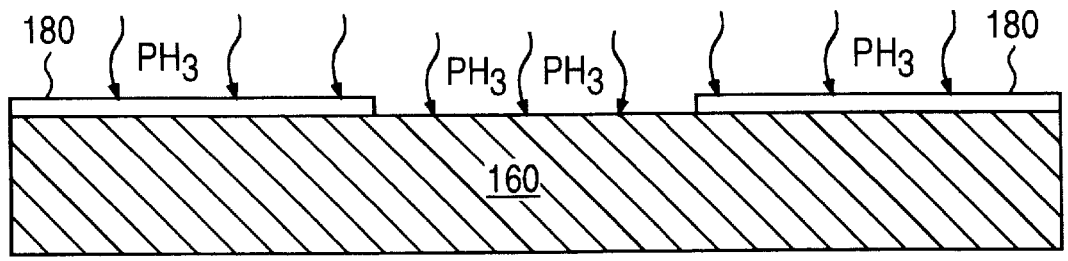
Figure 12:
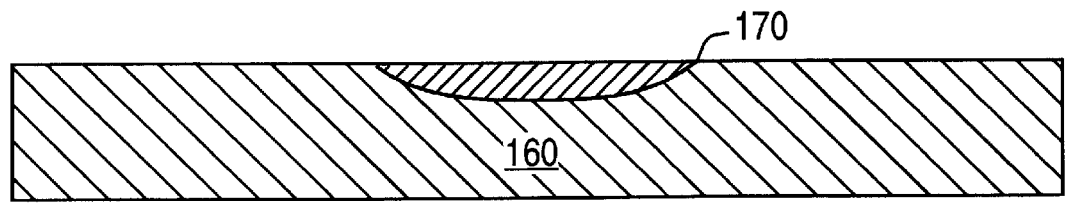
Figure 13:
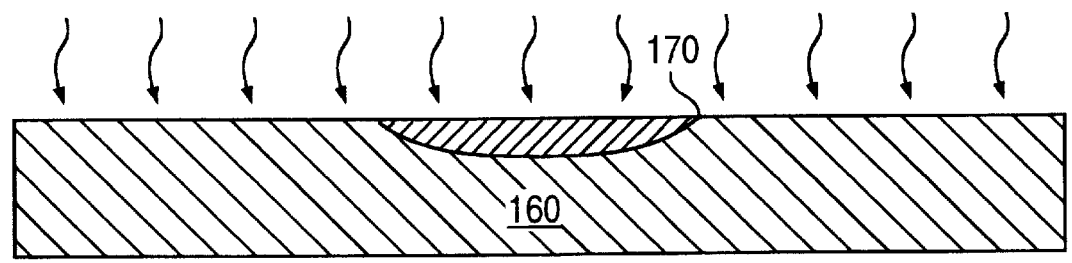
Figure 14:
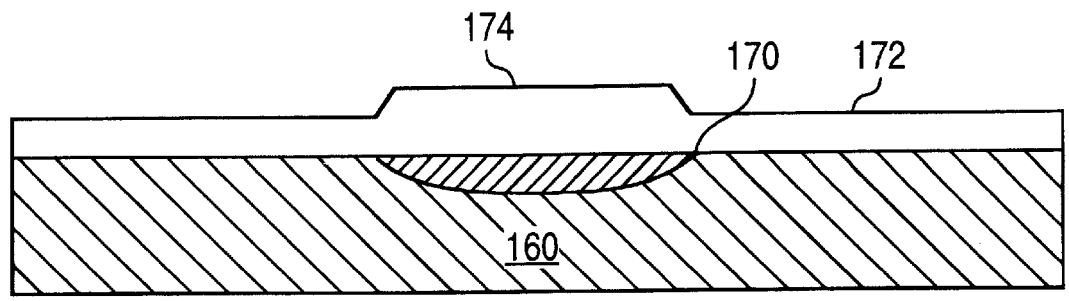

FIGS. 9–14 show an alternative method of the present invention similar to that shown in FIGS. 3–8, except that a reflective mask layer 180 is provided on the surface of silicon substrate 160. Reflective mask layer 180 can be, for example, an aluminum masking layer, or an oxide masking layer. The oxide masking layer has the advantage that metal contamination of the resulting structure is avoided. As shown in FIG. 10, the substrate including mask layer 180 is again placed in a phosphorus containing atmosphere, laser energy is applied in FIG. 11, and the phosphorus region 170 is formed as shown in FIG. 12. Again, the energy can be formed utilizing a melt or non-melt process, and if a non-melt process is used, a laser annealing step as shown in FIG. 13 may be utilized. The step shown in FIG. 13 would not be required if a melt process is utilized, as discussed above, but it's use with a melt GILD process is contemplated. As shown in FIG. 14, a layer of oxide is again grown in a manner similar to that described with respect to FIG. 8.

Hence, in any of the various modes of the present invention, a uniform and reliable oxide layer is formed having at least a first thickness and a second thickness. It should be recognized that through the use of differently patterned reticles, the control over various incorporated regions into the substrate can be varied so that certain regions of the substrate have a greater amount of oxide enhancing compound than others, thereby further controlling the differential between the growth of such regions with respect to other doped and non-doped regions, thereby yielding an oxide layer with any number of thicknesses through a single growth step.

The many features and advantages of the present invention should be apparent to one of average skill in the art. All such features and advantages are intended to be within the scope of the invention as defined by the present specification, and the following claims. It should be recognized that the method of the present invention is not limited to its uses in memory technology, but would be applicable in any semiconductor method fabrication process requiring a uniform and reliable oxide layer on a semiconductor substrate. The present invention provides a unique method for introducing oxide enhancing compound, such as phosphorus, into a shallow region in the silicon substrate in order to enable differential oxide growth.

What is claimed is:

1. A method for forming an oxide on the surface of a semiconductor substrate, comprising:

placing the semiconductor substrate in an atmosphere containing an oxidation enhancing compound;

applying laser energy to at least a first portion of the substrate; and forming the oxide on the surface of the substrate by heating the substrate.

2. The method of claim 1, further comprising the step of:

positioning a reflective reticle to pattern the laser over the semiconductor substrate.

3. The method of claim 1, further comprising the step of:

forming a mask on the semiconductor substrate.

4. The method of claim 1, wherein the oxidation enhancing compound atmosphere includes phosphorus.

5. The method of claim 1, wherein the oxidation enhancing compound atmosphere includes arsenic.

6. The method of claim 1, wherein the oxidation enhancing compound atmosphere includes boron.

7. A method for forming an oxide on the surface of a semiconductor substrate, comprising:

immersing the semiconductor substrate in a phosphorus containing atmosphere;

applying a laser to a portion of the substrate to induce incorporation of the phosphorus into the portion of the substrate to a depth dependent upon the strength of the laser energy directed at the surface of the substrate; and forming the oxide on the surface of the substrate by heating the substrate in an oxidizing ambient such that the portion of the oxide formed over the selected portion is formed at a different rate than a portion of the oxide formed over regions of the substrate not including the selected portion.

8. The method of claim 7, wherein the immersion step includes the step of positioning a reflective reticle to pattern the laser over the substrate.

9. The method of claim 7, wherein the method further comprises the step of applying the laser for a second time to eliminate damage caused by incorporation.

10. The method of claim 7, wherein the incorporation is through solid phase diffusion.

11. The method of claim 7, wherein the incorporation is through liquid phase diffusion.

12. A method for forming an oxide on a semiconductor substrate, comprising the steps of:

forming a mask layer on the surface of the semiconductor substrate;

immersing the semiconductor substrate in an oxide enhancing compound containing atmosphere;

applying a laser to a portion of the substrate to induce incorporation of the oxide enhancing compound into the portion of the substrate to a depth dependent upon the strength of the laser energy directed at the surface of the substrate; and forming the oxide on the surface of the substrate by heating the substrate in an oxidizing ambient such that the portion of the oxide formed over the selected portion is formed at a different rate than a portion of the oxide formed over regions of the substrate not including the selected portion.

13. The method of claim 12, wherein the immersion step includes the step of applying a reflective reticle to the substrate.

14. The method of claim 12 wherein the method further comprises the step of applying the laser for a second time to eliminate damage caused by incorporation.

15. The method of claim 12, wherein the deposition is through solid phase diffusion.

16. The method of claim 12, wherein the deposition is through liquid phase diffusion.

17. The method of claim 12, wherein the energy of the laser is between approximately 650 MJ/cm$^2$ and approximately 1.3 J/cm$^2$.

18. The method of claim 12, wherein the energy of the laser for non-melt P-GILD is less than 650 mJ/cm$^2$.

19. The method of claim 12, wherein the laser is a 308 nm excimer laser.

20. A method for forming an oxide on the surface of a semiconductor substrate, the oxide having at least a first thickness and a second thickness, comprising the steps of:

gas immersion laser doping a region of the substrate with material containing an oxidation enhancing compound; and heating the substrate in an oxygen atmosphere.

21. The method of claim 20, wherein the oxide enhancing compound includes phosphorus.

22. The method of claim 20, wherein the oxide enhancing compound includes arsenic.

23. The method of claim 20, wherein the oxide enhancing compound includes boron.

24. The method of claim 20, wherein the method further includes the step of:

positioning a reflection reticle.

25. The method of claim 20, wherein the method further includes the step of:

forming a mask on the substrate.

* * * * *